(12) United States Patent
Suleiman et al.

(10) Patent No.: US 8,822,274 B2
(45) Date of Patent: Sep. 2, 2014

(54) PACKAGED IC HAVING PRINTED DIELECTRIC ADHESIVE ON DIE PAD

(71) Applicant: Texas Instruments Incorporated, Dallas, TX (US)

(72) Inventors: Wan Mohd Misuari Suleiman, Wilayah Persekutuan (MY); Azdhar Dahalan, Selangor (MY)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/644,627

(22) Filed: Oct. 4, 2012

(65) Prior Publication Data
US 2014/0097526 A1 Apr. 10, 2014

(51) Int. Cl.
*H01L 21/50* (2006.01)

(52) U.S. Cl.
USPC ........... 438/113; 257/106; 257/112; 257/124; 257/E21.499

(58) Field of Classification Search
USPC .......... 438/106–127; 257/675–678, 701, 737, 257/778
See application file for complete search history.

(56) References Cited

U.S. PATENT DOCUMENTS

| | | | |
|---|---|---|---|
| 2001/0005044 A1* | 6/2001 | Fjelstad | 257/678 |
| 2005/0189658 A1* | 9/2005 | Xiaochun et al. | 257/782 |
| 2007/0132075 A1 | 6/2007 | Masumoto | |
| 2010/0304532 A1 | 12/2010 | Kenganantanon et al. | |
| 2011/0140253 A1* | 6/2011 | Lee et al. | 257/676 |

* cited by examiner

*Primary Examiner* — Dung A. Le
(74) *Attorney, Agent, or Firm* — Steven A. Shaw; Frederick J. Telecky, Jr.

(57) ABSTRACT

A method of assembling a packaged integrated circuit (IC) includes printing a viscous dielectric polymerizable material onto a die pad of a leadframe having metal terminals positioned outside the die pad. An IC die having a top side including a plurality of bond pads is placed with its bottom side onto the viscous dielectric polymerizable material. Bond wires are wire bonded between the plurality of bond pads and the metal terminals of the leadframe.

13 Claims, 6 Drawing Sheets

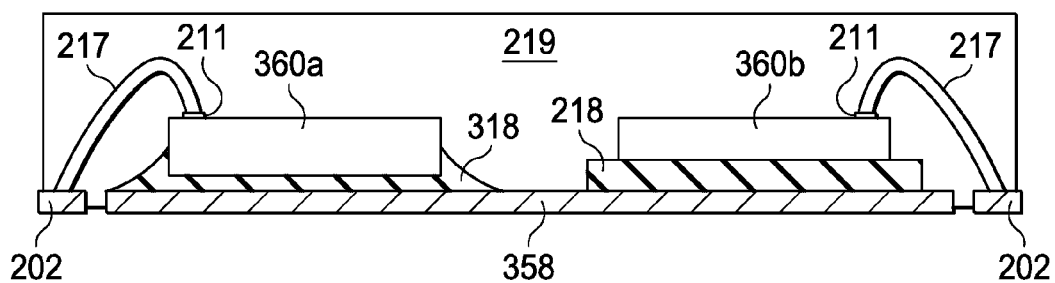
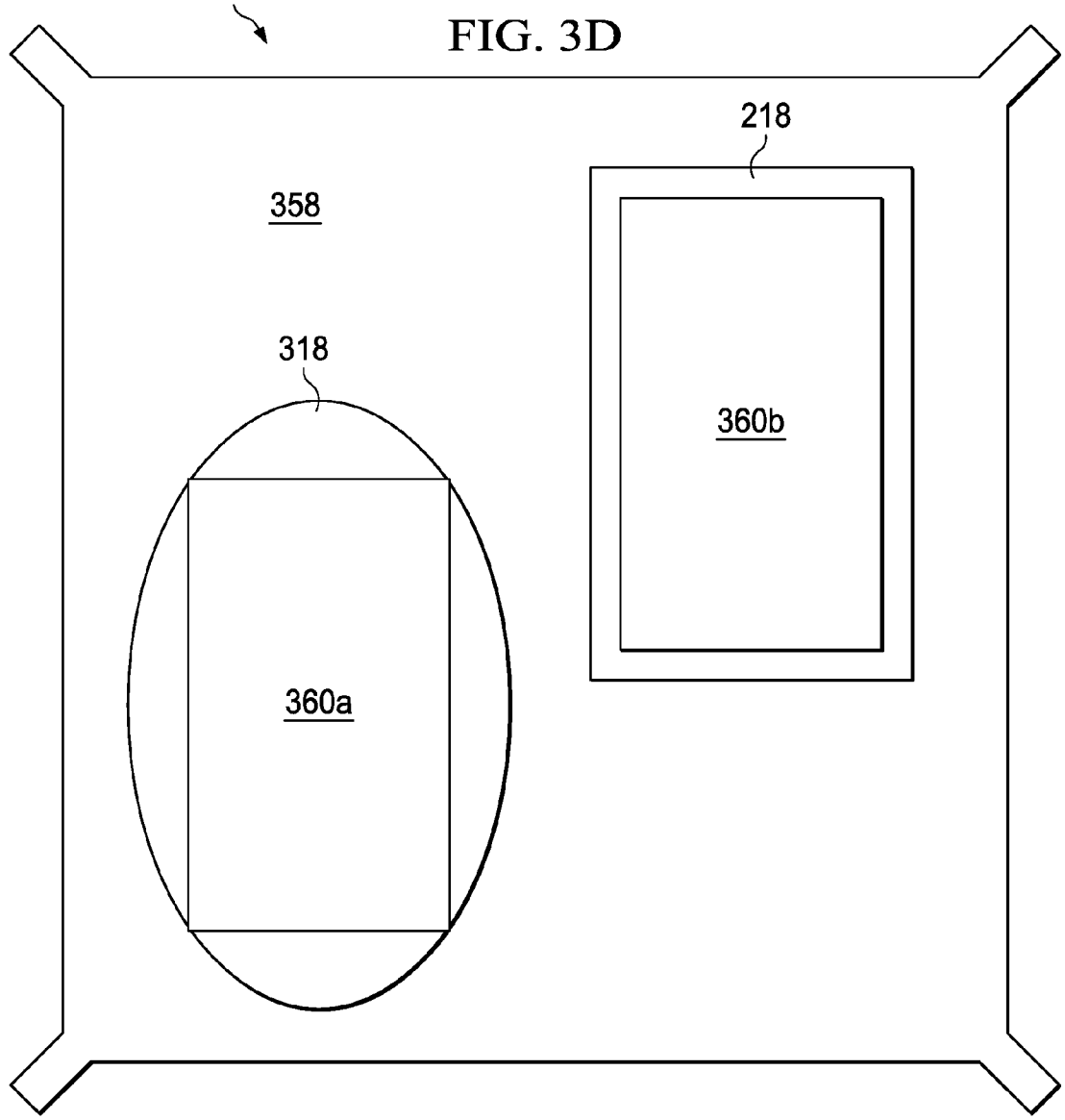

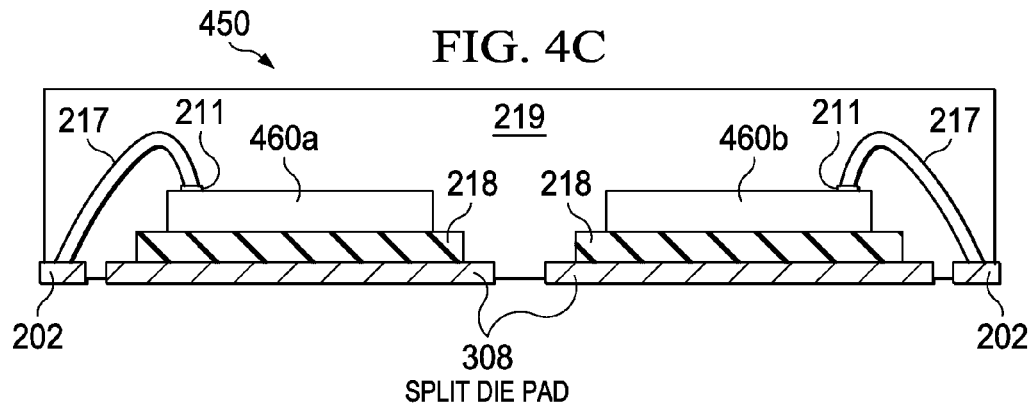
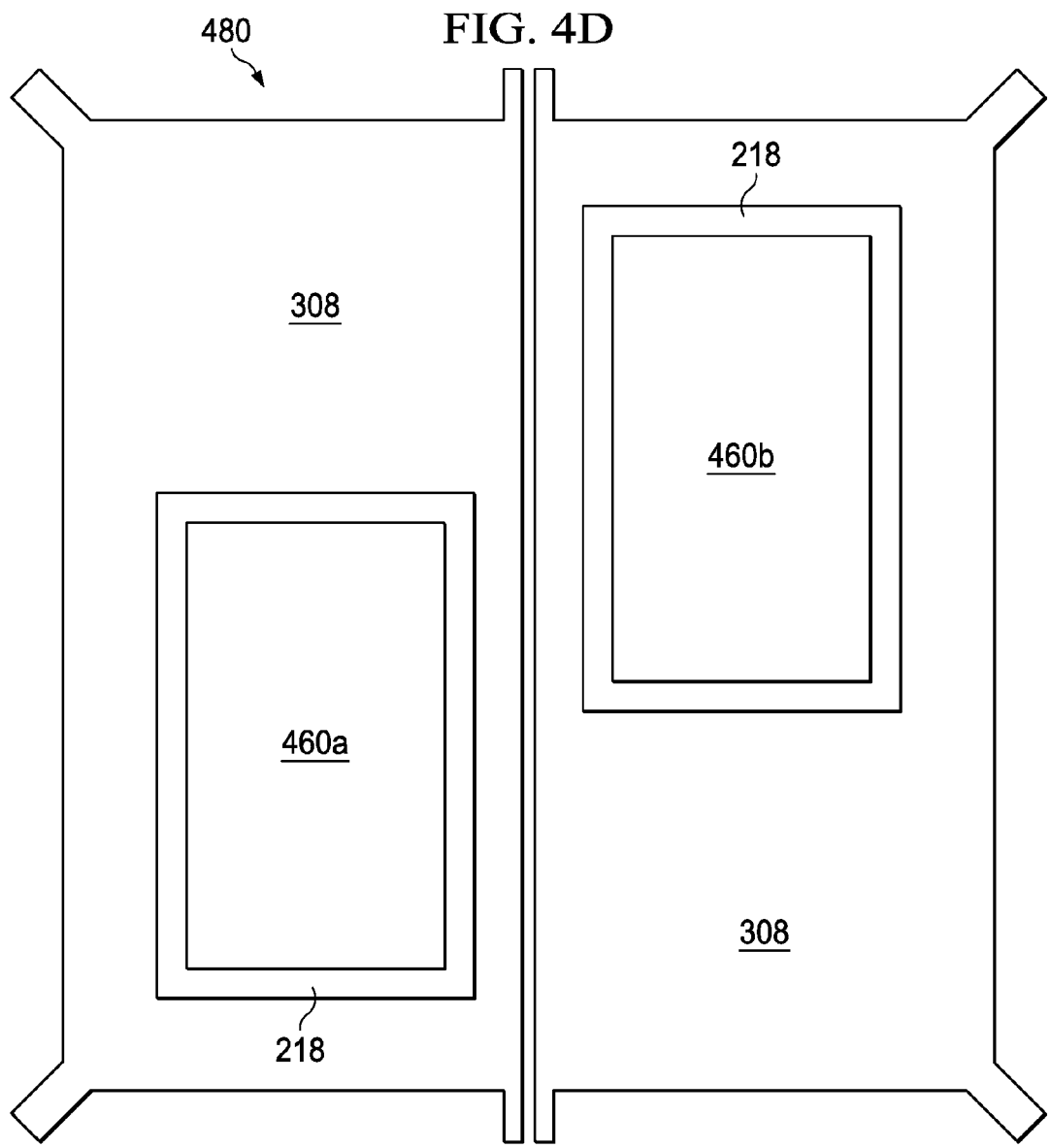

PACKAGED IC HAVING PRINTED DIELECTRIC ADHESIVE ON DIE PAD

FIELD

Disclosed embodiments relate integrated circuit (IC) assembly, and more particularly to attachment of semiconductor IC die to leadframes and packaged ICs therefrom.

BACKGROUND

During assembly of packaged semiconductor ICs, the bottom side of a semiconductor IC die is typically attached by a solid form dielectric die attach film (DAF), such as a fully cured epoxy, to a die paddle (or die pad) of a leadframe. Bond pads on the IC die are then attached to metal terminals of the leadframe by bond wires.

Some ICs are designed to electrically contact the bottom side of IC die, while other ICs are designed for the bottom side of IC die to be electrically isolated from the die pad. For packaged ICs where the IC die needs its bottom side to be electrically isolated from the die pad, and a potential difference exists between the bottom side of the IC die and the die pad during operation, electrical leakage between the bottom side of the IC die to the die pad through the dielectric DAF due to DAF isolation failure can lead to yield loss during electrical test, or lead to electrical failures during field use.

SUMMARY

Disclosed embodiments recognize a cause of electrical leakage and yield loss for packaged integrated circuits (ICs) where the bottom side of the IC die is designed to be electrically isolated from the die pad is due to dielectric die attach isolation failures. Failure mechanisms recognized include missing dielectric DAF on the edge of the DAF due to tearing during die pick-up at die attach processing, and voids (e.g., pinholes) in the DAF for conventional IC die having laminated DAF thereon before wafer singulation. Such events can expose the bottom side of the IC die to the metal die pad surface (e.g., copper or copper alloy) after die placement on the die pad which can lead to electrical leakage, such as due to the presence of silicon splinters or moisture which can function as connecting (electrically conducting) bridges.

Disclosed embodiments solve die attach isolation problem by printing an adhesive in the form of a viscous polymerizable material (e.g., an epoxy) onto the die pad. Since there is no dielectric material on the bottom side of the IC die during die pick-up at die attach processing, die pick-up induced dielectric isolation problems are eliminated. Since printing a viscous polymerizable material is used instead of dispensing (e.g., needle dispensing or by jetting) a liquid form die attach adhesive, disclosed methods avoid bleed out or overflow that can occur if a liquid form polymer adhesive is dispensed, particularly for packaged ICs having large die size to die pad ratios, such as in a range from 0.8 to 1.0.

Disclosed packaged ICs have a characteristic structure since the area of the printed dielectric polymer die attach material is greater than the area of the IC die. Accordingly, there will be some dielectric polymer die attach material extending lateral to the IC die resulting in an interface with the mold compound. In addition, the dielectric polymer die attach material provides substantially vertical outer walls, defined herein as being 80 to 100 degrees relative to a top surface of the die pad.

BRIEF DESCRIPTION OF THE DRAWINGS

Reference will now be made to the accompanying drawings, which are not necessarily drawn to scale, wherein:

FIG. 3C is a cross sectional view of an example leadless packaged MCM having a first IC die including a dielectric die attach polymer material formed by a process using dispensed epoxy die attach and a second IC die including a dielectric die attach polymer material formed by a process using printed epoxy die attach on a single die pad, according to an example embodiment. FIG. 3D a top view depiction of the first IC die and second IC die on their respective dielectric polymer die attach materials on the single die pad shown in FIG. 3C.

FIG. 4C is an example leadless packaged MCM having a first IC die and a second IC die both including a dielectric die attach polymer material formed by a process using printed epoxy die attach, on a split die pad, according to an example embodiment. FIG. 4D is a top view depiction of the first IC die and second IC die on dielectric polymer die attach material on the split die pad shown in FIG. 4C.

DETAILED DESCRIPTION

Figure 1:
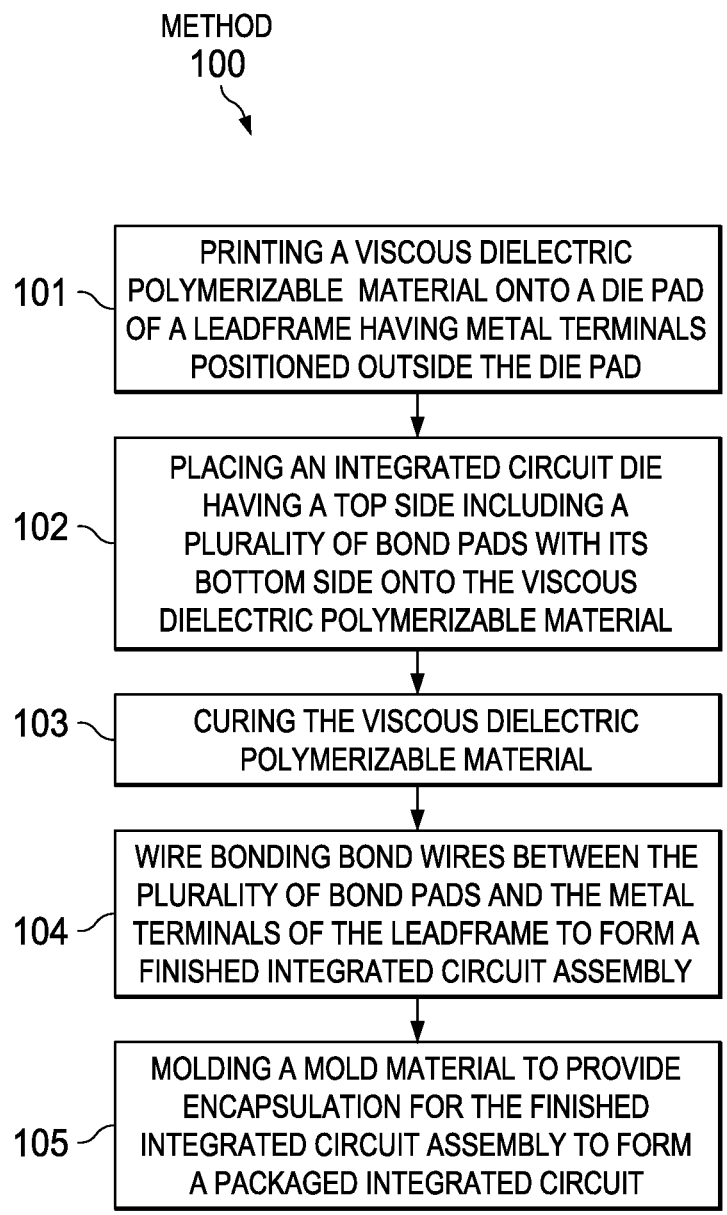
FIG. 1 is a flow chart that shows steps in an example method of assembling a packaged IC including printing a viscous polymerizable material onto the die pad, according to an example embodiment.

Example embodiments are described with reference to the drawings, wherein like reference numerals are used to designate similar or equivalent elements. The drawings are not necessarily drawn to scale. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of assembling a packaged IC including printing a viscous dielectric polymerizable material onto the die pad, according to an example embodiment. Prior to method 100, a substrate (e.g., a silicon wafer) after completing wafer fabrication including a plurality of IC die is bottom side thinned (e.g., background), and is then laminated with a dicing tape. Following optional ultraviolet (UV) irradiation, the IC die are then singulated (i.e., separated by cutting).

Step 101 comprises printing a viscous dielectric polymerizable material onto the die pad (or die paddle) of a leadframe having metal terminals positioned outside the die pad. "Printing" as used herein refers to directing a viscous material to a structure positioned above the die pad including a masking structure (e.g., a screen or a stencil) having at least one aperture to form a pattern of the viscous material on the die pad in an area defined by the aperture. "Viscous" as used herein refers to the material being flowable, to allow application by stencil printing or screen printing. Example viscous dielectric polymerizable materials (before any curing) may have a 25° C. Brookfield viscosity in the range from 1,000 to 200,000 mPa·S (cP), typically in the range from 20,000 to 80,000 cP. A partial cure is generally performed before or after printing, and before die bonding (step 102 described below). For example, for a typical epoxy, a partial cure in a oven after printing and before die bonding using a temperature range of 60° C. to 140° C. for a duration of 20 mins to 3 hrs may be used.

As used herein, a "polymerizable material" refers to a material that it is a viscous blend of solid resins in a solvent carrier. The viscous dielectric polymerizable material may be considered to be a B-stage thermosetting resin after partial cure processing, such as described above, which may provide partially curing of the material (some polymerization; typically less than 10%). When this system is then reheated at elevated temperatures or suitably irradiated, the cross-linking can be complete so that the system fully cures (crosslinks).

The dielectric polymerizable material can be printed using a screen printing fixture onto a plurality of die pads for respective leadframes of a leadframe sheet (or leadframe carrier). Screen printing is known in the printing and surface coating arts to be a printing technique that uses a screen printing fixture comprisng a woven mesh that supports a stencil which provides a blocking function. The attached stencil forms open areas of mesh that transfer a printable material which can be pressed through the mesh as a sharp-edged image onto a surface of a substrate. A fill blade (or squeegee) is moved across the screen stencil, forcing or the printable material onto the mesh openings for transfer by capillary action during the squeegee stroke. Stencil printing is another printing method that uses a metal stencil (thin metal sheet with openings). The leadframe can be a leaded leadframe or a leadless leadframe (small-outline no leads (SON)), including a quad-flat no-leads (QFN) or dual-flat no-leads (DFN).

The dielectric polymer die attach material comprises a cross-linkable polymer, such as an epoxy copolymer, for example ABLECOAT 8006NS (Henkel Adhesives, Irvine, Calif.), or other suitable dielectric cross-linkable materials. Epoxies are also known as polyepoxides in the chemical arts, which are a class of thermosetting polymers formed from reaction of an epoxide "resin" with polyamine "hardener". When the resin and hardener are mixed, covalent bonds are formed. After suitable curing the material is heavily crosslinked, and is thus rigid and strong.

The dielectric polymerizable material printed is generally in a thickness range from 5 μm to 100 μm. Since the dielectric polymerizable material is on the die pad, there is no need for the bottom side of the IC die to be provided a die attach material. However, the bottom side of the IC die can optionally be provided a dielectric die attach material, such as a conventional DAF.

Step 102 comprises a die attach step comprising placing an IC die having a plurality of bond pads on its top side with its bottom side onto the dielectric polymerizable material. The die can be pick and placed onto the dielectric polymerizable material on the die pad. During this step the IC die or die pad is generally heated to 50° C. to 180° C. during bonding the IC die to the printed dielectric polymerizable material. Epoxy bleed out or overflow is eliminated due to use of the viscous dielectric polymerizable material that has been partially cured (e.g., B-stage epoxy), as opposed to the dispensing of a liquid epoxy.

The dielectric polymerizable material is then generally heated or irradiated to harden it to C-stage, so that the resulting polymer is heavily crosslinked, and is thus rigid and strong. Step 103 comprises curing the dielectric polymerizable material to complete the crosslinking, to render the material rigid and strong. Heat is generally used for the curing. For example, 20 minutes to 3 hours at 150° C. to 190° C. may be used.

Step 104 comprises wire bonding bond wires between the plurality of bond pads and metal terminals of the leadframe to form a finished IC assembly. After wire bonding each of the die pads to respective ones of the metal terminals of the leadframe, for the typical case of a leadframe sheet comprising a plurality of leadframes, the finished IC assemblies are then separated from one another. Step 105 comprises molding a mold material (e.g., an epoxy-based molding compound) to provide encapsulation for the finished IC assembly to form a packaged IC. The mold material is a different composition as compared to the dielectric polymer die attach material on the die pad. For example, the die attach material composition may be selected to provide a desired thermal conductivity for heat dissipation from the IC die, electrical properties, or other properties, while the mold material composition may be selected based on other considerations, such as moldability, impact strength and moisture resistance or other properties.

In the typical assembly case where the leadframes are part of a leadframe sheet, a singulation process cuts the leadframe sheet comprising a plurality of leadframes into separated finished ICs. A laser or a dicing saw can be used for singulation.

Figure 2A:
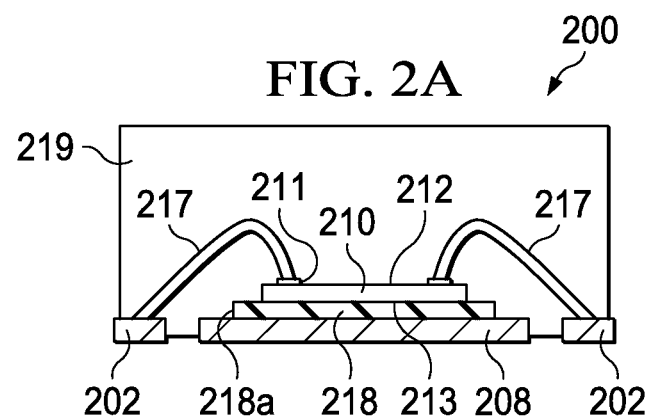
FIG. 2A is a cross sectional view of an example leadless packaged IC having dielectric die attached material on the die pad obtained by printing a viscous dielectric polymerizable material onto the die pad, according to an example embodiment.

FIG. 2A is a cross sectional view of an example leadless packaged IC 200 having a dielectric polymer die attach material 218 on the die pad 208 obtained by an assembly process including printing a dielectric polymerizable material onto the die pad, according to an example embodiment. Packaged IC 200 comprises a leadframe including metal terminals 202 positioned outside the die pad 208. An IC die 210 has a top side 212 including a plurality bond pads 211 and circuitry (e.g., transistors, interconnects. not shown) and a passive bottom side 213 attached by a dielectric polymer die attach material 218 obtained by printing a dielectric polymerizable material onto the die pad 208.

Figure 2B:
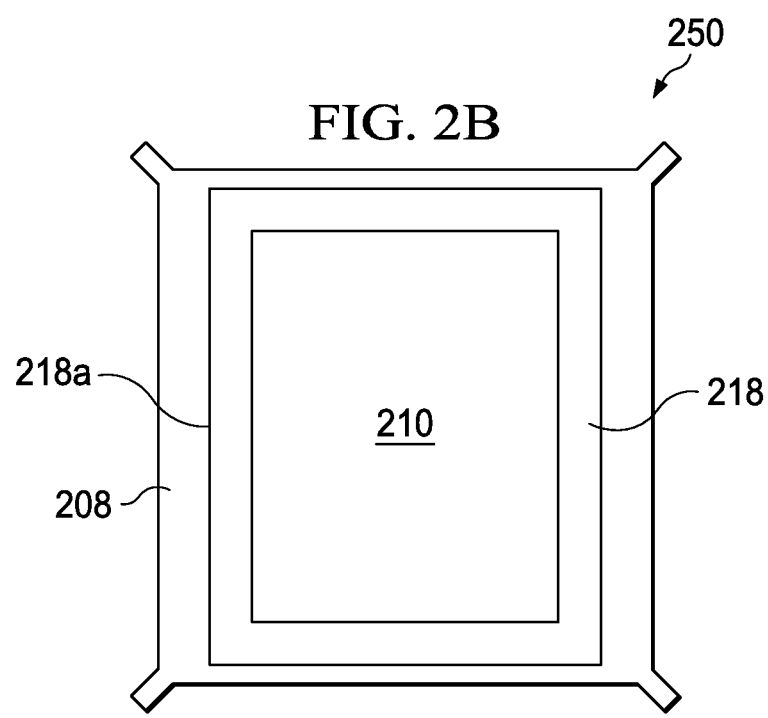
FIG. 2B is a top view depiction of the IC die on dielectric polymer die attach material on the die pad shown in FIG. 2A.

Bond wires 217 are between the bond pads 211 and the metal terminals 202. A mold material 219 (shown as "mold") provides encapsulation for the packaged IC 200. As shown, an area of the dielectric polymer die attach material 218 exceeds an area of the IC die 210, so that the dielectric polymer die attach material 218 interfaces with the mold material 219. The dielectric polymer die attach material also provides substantially vertical outer walls 218a (as noted above, defined herein as 80 to 100 degrees) relative to a top surface of the die pad. FIG. 2B is top view depiction 250 of the IC die 210 on dielectric polymer die attach material 218 on the die pad 208 shown in FIG. 2A.

Since the dielectric polymerizable material 218 is printed on the surface of the die pad 208 in a viscous form, there is no epoxy bleed out or overflow which can occur with dispensing a liquid form epoxy, particularly if applied to packages involving relatively large die size to die pad ratios. Disclosed embodiments are also enabling for MCM QFN/SON, since more IC die or modules can be placed into a single QFN package due to absence of epoxy bleed out or overflow.

For multi-chip module (MCM) applications one of the IC die may be attached using conventional dispensed die attach material to take advantage of the electrical and thermal performance of dispensed die attach material which might be higher as compared to printed die attach material, while another IC die in the MCM may be attached using printed die attach material as disclosed herein. In a typical dispensed and printed die attach material MCM embodiment, the printed die attach material will be of low electrical conductivity to provide electrical isolation for IC die requiring electrical isolation from the die pad, while the dispensed material will be electrically conductive (and also generally thermally conductive) material for IC die requiring electrical connection to the die pad.

Figure 3A:
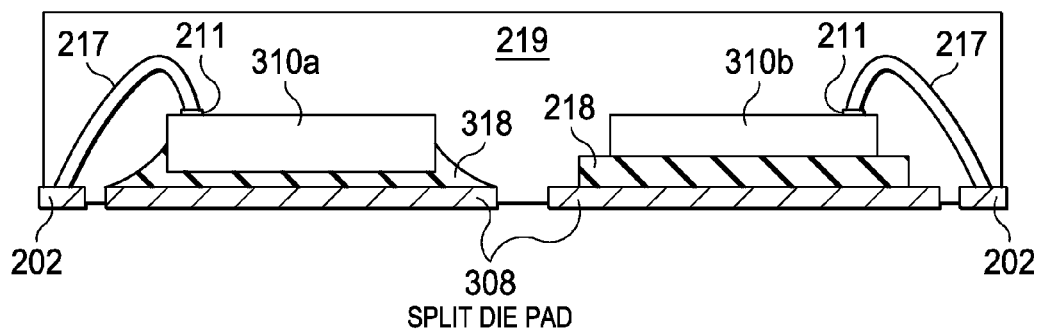
FIG. 3A is a cross sectional view of an example leadless packaged multi-chip module (MCM) having a first IC die including a dielectric die attach polymer material formed by a process using dispensed epoxy die attach and a second IC die including a dielectric die attach polymer material formed by a process using printed epoxy die attach, attached on a split die pad, according to an example embodiment.
Figure 3B:
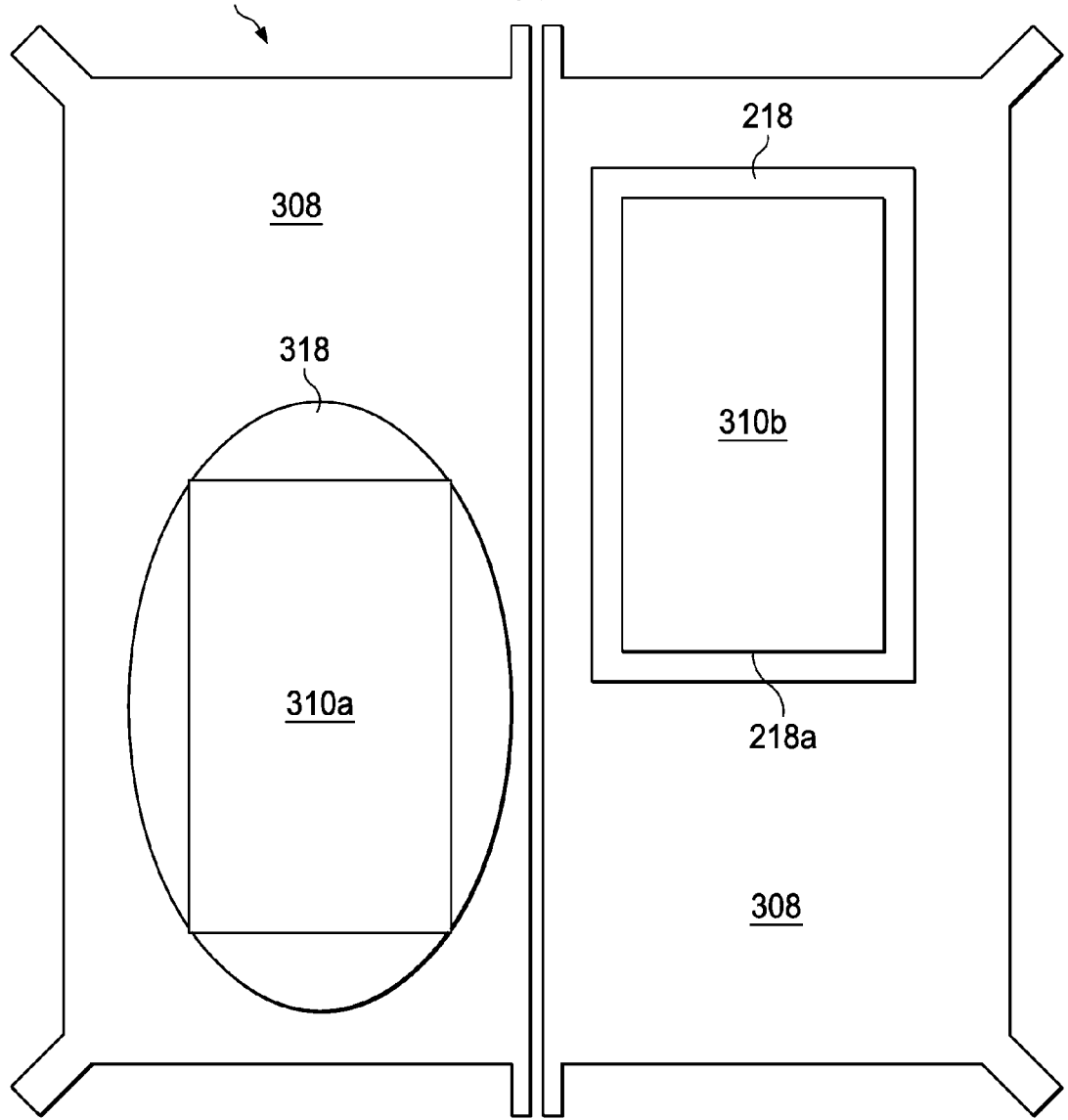
FIG. 3B is a top view depiction of the first IC die and second IC die on their respective dielectric polymer die attach materials on the split die pad shown in FIG. 3A.

FIG. 3A is a cross sectional view of an example leadless packaged multi-chip module (MCM) 300 having a first IC die 310a including a dielectric die attach polymer material 318 formed by a process using dispensed epoxy die attach and a second IC die 310b including a dielectric die attach polymer material 218 formed by a process using printed epoxy die attach, attached on a split die pad 308, according to an example embodiment. FIG. 3B is a top view depiction 330 of the first IC die 310a and second IC die 310b on their respective dielectric polymer die attach materials on the split die pad 308 shown in FIG. 3A.

FIG. 3C is a cross sectional view of an example leadless packaged MCM 350 having a first IC die 360a including a dielectric die attach polymer material 318 formed by a process using dispensed epoxy die attach and a second IC die 360b including a dielectric die attach polymer material 218 formed by a process using printed epoxy die attach on a single die pad 358, according to an example embodiment. FIG. 3D a top view depiction 380 of the first IC die and second IC die on their respective dielectric polymer die attach materials on the single die pad 358 shown in FIG. 3C.

Figure 4A:
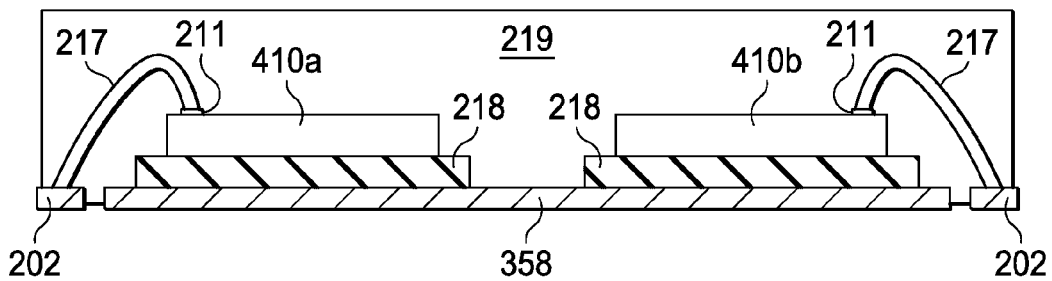
FIG. 4A is a cross sectional view of an example leadless packaged MCM having a first IC die and a second IC die both including a dielectric die attach polymer material formed by a process using printed epoxy die attach, with dispensed epoxy die attach on a single die pad, according to an example embodiment.
Figure 4B:
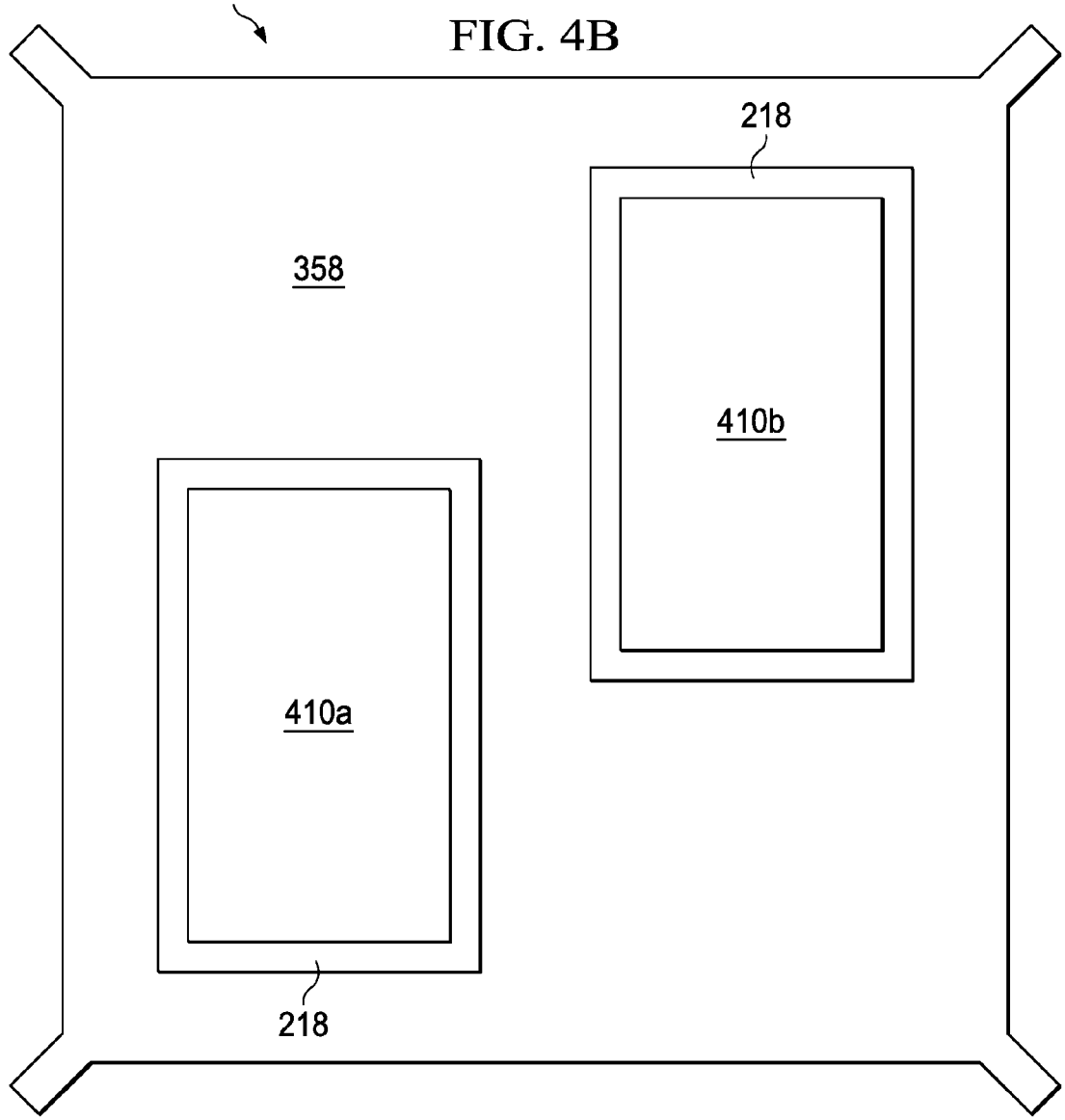
FIG. 4B a top view depiction of the first IC die and second IC die on the dielectric the attach polymer material on the single die pad shown in FIG. 4A.

FIG. 4A is a cross sectional view of an example leadless packaged MCM 400 having a first IC die 410a and a second IC die 410b both including a dielectric die attach polymer material 218 formed by a process using printed epoxy die attach, with dispensed epoxy die attach on a single die pad 358, according to an example embodiment. FIG. 4B is a top view depiction 430 of the first IC die 410a and second IC die 410b on the dielectric polymer die attach material 218 on the single die pad 358 shown in FIG. 4A.

FIG. 4C is an example leadless packaged MCM 450 having a first IC die 460a and a second IC die 460b both including a dielectric die attach polymer material 218 formed by a process using printed epoxy die attach, on a split die pad 308, according to an example embodiment. FIG. 4D is a top view depiction 480 of the first IC die 460a and second IC die 460b on dielectric polymer die attach material 218 on the split die pad 308 shown in FIG. 4C.

Disclosed embodiments can be integrated into a variety of assembly flows to form a variety of different IC devices and related products. The IC assembly can comprise single IC die or multiple IC die, such as PoP configurations comprising a plurality of stacked IC die. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A method of assembling a packaged integrated circuit (IC), comprising:
    printing a viscous dielectric polymerizable material onto a die pad of a leadframe having metal terminals positioned outside said die pad;
    placing at least one IC die having a top side including a plurality of bond pads with its bottom side onto said viscous dielectric polymerizable material; and
    wire bonding bond wires between said plurality of bond pads and said metal terminals of said leadframe.

2. The method of claim 1, further comprising partially curing said viscous dielectric polymerizable material to form a B-stage material before said placing.

3. The method of claim 2, wherein said partial curing comprises heating 20 mins to 3 hrs at a temperature between 60° C. and 140° C.

4. The method of claim 2, further comprising further curing said B-stage material before said wire bonding.

5. The method of claim 4, wherein said further curing comprises heating 20 minutes to 3 hours at a temperature between 150° C. and 190° C.

6. The method of claim 1, wherein said viscous dielectric polymerizable material comprises an epoxy.

7. The method of claim 1, wherein said leadframe comprises a leadless leadframe.

8. The method of claim 1, further comprising encapsulating with a mold material after said wire bonding.

9. The method of claim 1, wherein said at least one IC die comprises at least a first IC die and a second IC die positioned lateral to one another on said die pad to provide a multi-chip module (MOM).

10. The method of claim 9, wherein said die pad is a split die pad.

11. The method of claim 9, wherein said die pad consists of a single die pad.

12. The method of claim 9, wherein said printing is used for said first IC die, and further comprising dispensing a dielectric liquid polymer material is for attachment of said second IC die to said die pad.

13. The method of claim 9, wherein said printing is used for both said first IC die and for said second IC die.

* * * * *